US007015695B2

(12) United States Patent
Tropp et al.

(10) Patent No.: US 7,015,695 B2
(45) Date of Patent: Mar. 21, 2006

(54) SHIELDED TEM SURFACE ARRAY FOR PARALLEL IMAGING

(75) Inventors: James S. Tropp, Berkeley, CA (US); Daniel K. Sodickson, Newton, MA (US); Michael A. Ohliger, Cambridge, MA (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/709,171

(22) Filed: Apr. 19, 2004

(65) Prior Publication Data

US 2005/0231200 A1   Oct. 20, 2005

(51) Int. Cl.
  *G01V 3/00*   (2006.01)
(52) U.S. Cl. .................................. 324/318; 324/309
(58) Field of Classification Search ................ 324/318, 324/319, 322, 309, 307, 300, 321
See application file for complete search history.

(56) References Cited

U.S. PATENT DOCUMENTS

| 6,556,012 B1 * | 4/2003 | Yamashita ................... 324/318 |
| 6,618,610 B1 * | 9/2003 | Nabetani ..................... 600/422 |
| 2003/0020476 A1 * | 1/2003 | Duensing ..................... 324/318 |

OTHER PUBLICATIONS

Bogdanov et al; Magnetic Resonance in Medicine 47: 579-593 (2002).*

* cited by examiner

*Primary Examiner*—Brij B. Shrivastav
(74) *Attorney, Agent, or Firm*—Peter Vogel; Artz & Artz, PC

(57) ABSTRACT

A MRI system having a scanning unit adapted to generate a parallel scan includes a substantially cylindrical member defining a scanning bore and a RF coil assembly mounted in the scanning bore. The RF coil assembly includes a TEM surface resonator.

19 Claims, 3 Drawing Sheets

L1, RX, typ 190 nH, Q ≈ 60 (body loaded)
L2, TRAP, typ 30 nH, parallel resonant to $C_M$
$C_T$ TUNE, typ 39 pF; $C_M$ MATCH, typ 220 pF
$C = C_T C_M/(C_T + C_M)$
CR1 Pin Diode, bias (not shown) on for TX, off for RX
Z1, half wave line
U1, PREAMP, Rin ≈ 3-5 Ω

SHIELDED TEM SURFACE ARRAY FOR PARALLEL IMAGING

BACKGROUND OF INVENTION

The present invention relates generally to Magnetic Resonance Imaging (MRI) systems, and more particularly, to a method and system for parallel imaging.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a superconducting magnet capable of producing a strong, homogenous magnetic field around a patient or portion of the patient; a radio frequency (RF) transmitter and receiver system, including transmitter and receiver coils, also surrounding or impinging upon a portion of the patient; a magnetic gradient coil system also surrounding a portion of the patient; and a computer processing/imaging system, receiving the signals from the receiver coil and processing the signals into interpretable data, such as visual images.

The superconducting magnet is used in conjunction with a magnetic gradient coil assembly, which is temporally pulsed to generate a sequence of controlled gradients in the main magnetic field during a MRI data gathering sequence. Inasmuch as the main superconducting magnet produces a homogeneous field, no spatial property varies from location to location within the space bathed by such field; therefore, no spatial information, particularly pertaining to an image, can be extracted therefrom, save by the introduction of ancillary means for causing spatial (and temporal) variations in the field strength. This function is fulfilled by the above-mentioned gradient coil assembly; and it is by this means of manipulating the gradient fields that spatial information is typically encoded.

The actual image data consist of radiofrequency signals, which are stimulated and received by means of systems of resonant radiofrequency coils which irradiate the patient in the scanning volume. These coils typically fall into two classes: volume and surface resonators.

A volume resonator encloses an entire volume to be irradiated; a surface resonator lies atop a surface portion of some object to be irradiated. A volume resonator is typically employed as a combined transmitter/receiver, or as a dedicated transmitter, with no receiver functionality. A surface coil is sometimes employed as a combined transmitter/receiver; but more frequently it is used as a dedicated receiver, in conjunction with a separate volume coil serving as a transmitter. The surface receiver coil must be fitted with switchable blocking circuitry, to quench its response to the externally applied radiofrequency fields during the transmit period. Multiple surface resonators may, if suitably fitted with switchable protection circuitry, be further combined into receiver arrays, (for use with a separate transmitter coil) as is known in the art and described in more detail hereinbelow. Furthermore, since individual surface resonators (belonging to a receiver array) possess each a degree of spatial discrimination, due to the spatial variation of their reception sensitivity, and particularly to its localization in regions of close proximity to each surface coil, it is therefore possible to derive therefrom a degree of spatial information, based upon said localization of sensitivity by individual coils, whose sensitivity variations have been previously characterized in a suitable calibration sequence. Having available such information renders redundant a portion of the spatial encoding derived from the temporal sequencing of gradient fields, so that certain portions of the gradient sequence can be dispensed with, and, by suitable reconstruction means as known in the art, an image be reconstructed with limited gradient data, combined with localizing information derived from the radiofrequency coils. Since a portion of the gradient sequence is rendered redundant, the data collection process is shortened thereby, and the imaging process speeded. This essentially is the method of parallel imaging. It is to be noted that the larger the number of surface coils producing local information, the larger the acceleration of data gathering that can be realized.

To elaborate on the above: in the course of a typical MRI scan, RF signals of short duration (pulses) at suitable frequencies and in suitable temporal sequence are transmitted into the scanning bore by means of RF coils mentioned above. These pulses stimulate in the patient (or object to be imaged) nuclear magnetic resonance (NMR) signals in response, which are then allowed to evolve under then influence the abovementioned gradient sequences, and are (at times concurrent with playing of a gradient) received via suitable RF coils. Information encoded within the frequency and phase parameters of the received RF signals is then processed (by a suitable application of Fourier transform techniques, as known in the art) to form visual images. These visual images represent the distribution of an NMR sensitive nucleus (typically hydrogen), as weighted by relaxation factors, within a cross-section or volume of the patient within the scanning bore.

The present invention, as will be discussed in the specification, is particularly concerned with a particular type of radiofrequency resonator, known in the terminology of MRI as a transverse electromagnetic wave resonator (hereinafter TEM resonator or TEM), which is a type of multimode resonator, used to preferentially excite a particular electromagnetic frequency. Typically the resonator comprises an outer conductive cylinder containing within, as will be described, a plurality low-pass pi resonant elements of rod-like aspect, whose axes are aligned parallel to that of the outer cylinder. The low pass elements are grounded to the cylinder, which therefore serves the dual functions of electromagnetic shield and current return path.

In many typical TEM resonators, the pi circuits are fabricated from segments of coaxial line, by making a gap in the center conductors at their midpoints. The length of the gap determines the low pass capacitance; the overall length and diameter of the segment, together with its stand off distance from the shield together determine the low-pass inductance.

In other typical TEM resonators, the segments are simply self-resonant, axially-directed rods, with a very small lumped capacitance at either end to provide electrical foreshortening. By extension, the axial rods may be chosen far from self-resonance, and a large capacitance applied to achieve resonance. Since the shield still provides the return path, the resonator is referred to as the lumped element TEM.

It is known that the TEM configuration is adaptable to surface coil geometry. The principal advantage to this is geometric simplicity and the partial shielding achieved, particularly for imaging fields above 3.0 T. TEM geometry has also been adapted to multi-element surface arrays, but designs to date have been constrained to quarter wave sections (distributed or lumped) for the elements, to achieve (what has until now been considered) adequate inter-element circuit decoupling, or isolation: hitherto considered necessary to prevent image artifacts arising from inter-channel cross-talk among individual elements of the array. In conventional receiver arrays (typically comprising loop resonators) the isolation is achieved by a combination of overlapping the loops, plus the use of a low-impedance preamplifier in conjunction with the circuitry already in place to block the transmitter pulse (vide supra).

The particular requirement for quarter wave elements in TEM arrays is due to the rather strong coupling which exists between the elements and which is not altogether overcome by the blocking circuitry and preamplifier. This requirement restricts the resonant element geometry in ways that are potentially undesirable, e.g. to achieve quarter wave lumped elements, length and conductor spacing must combine to produce an inductive reactance of 50 ohms.

Now it would be desirable to have a TEM resonator without requiring quarter wave sections, to allow MRI designers to tailor resonator geometry for optimal coverage of the patient to be imaged. Abandoning the constraint of quarter wave elements still leaves the necessity of applying a certain degree of isolation from the otherwise strongly coupled TEM resonant elements. The requisite isolation is deemed achievable via the conventional isolation circuitry and low impedance preamplifier, as is known in the art. In this regard it has recently been shown theoretically (13) that parallel imaging reconstruction is highly resistant to formation of artifacts from inter-channel cross-talk among array elements; and therefore, surface receiver arrays intended exclusively for parallel imaging are to some degree exempt from the usual rigorous requirements of isolation between channels; an inter-channel isolation of 10 dB is now considered tolerable between next-neighbor elements, whereas in the conventional imaging regime, the tolerable isolation was considered to be in the region of 20 to 30 dB.

SUMMARY OF INVENTION

In accordance with one aspect of the present invention, a MRI system having a scanning unit adapted to generate a parallel scan includes a substantially cylindrical member defining a scanning bore and a RF coil assembly mounted in the scanning bore. The RF coil assembly includes a TEM surface resonator array.

In accordance with another aspect of the present invention, a method for MRI scanning includes generating a parallel scan. The parallel scan data are received by means of a TEM surface resonator receiver array, (in conjunction with a transmit coil, whose particulars need not be specified) and the image of the object is reconstructed.

One advantage of the present invention (as noted above) is that relatively poor circuit coupling (−10 dB between near neighbor elements) is tolerable and will generate useable image reconstructions in parallel imaging. This isolation is achieved within the TEM geometry by the use of conventional means to be described and exemplified. A consequent advantage is that quarter wave elements are not necessary, and therefore the geometric constraints they require need not be imposed. The designer is resultantly allowed to tailor the resonant geometry for optimal coverage of the anatomy or object to be scanned.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

While the present invention is described with respect to a method for parallel imaging including a shielded TEM array, the present invention may be adapted to parallel imaging within various systems including: those for magnetic resonance spectroscopy systems, and magnetic resonance angiography. The TEM surface resonator is generally applicable to parallel imaging at high fields.

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient magnet assembly, or any other MRI system component known in the art.

Figure 1:
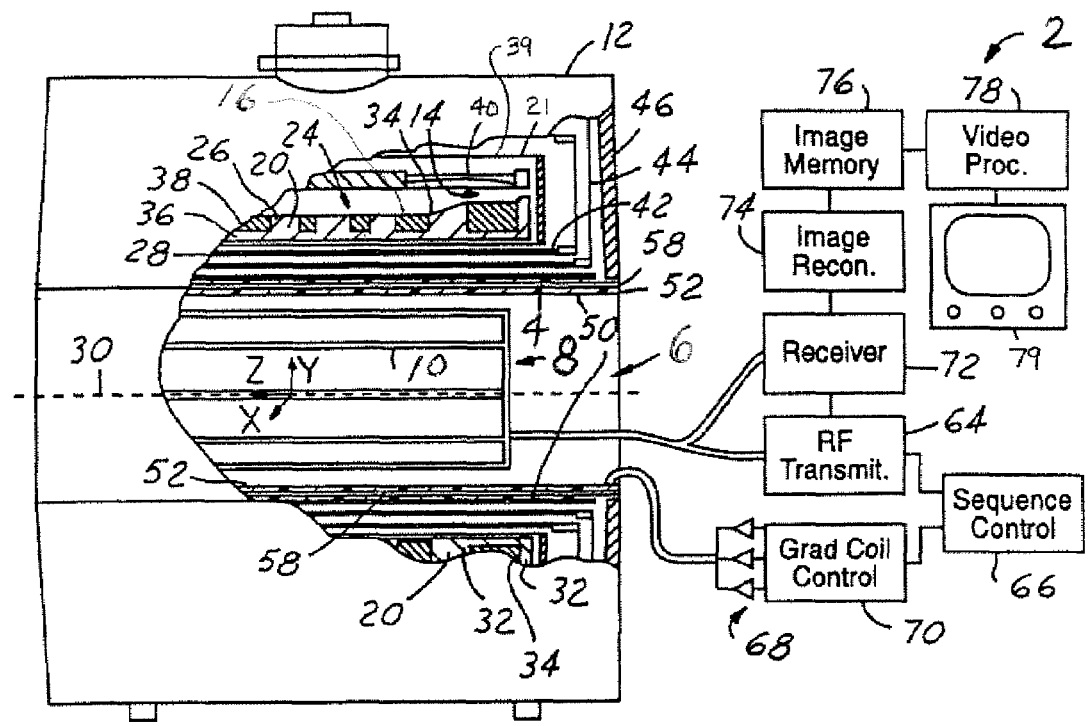
FIG. 1 is a block diagrammatic view of a MRI system in accordance with one embodiment of the present invention.

Referring now to FIG. 1, a block diagrammatic view of a MRI system 2 is shown. The system 2 includes a substantially cylindrical member 4 that defines a scanning bore 6. The scanning bore 6 includes a RF coil assembly 8 mounted therein. The RF coil assembly 8 includes a TEM surface resonator 10.

The MRI system 2 further includes a static magnet structure 12 including a superconducting magnet 14 having a plurality of superconducting magnetic field coils 16 which generate a temporally constant magnetic field along a longitudinal z-axis of a scanning bore 6. The superconducting magnet coils 16 are supported by a superconducting magnet coil support structure 20 and received in a cryostat 21.

The superconducting magnet coil support structure 20 provides support for static loads and allows fabrication and accurate placement of coils 16. Only one superconducting magnet 14 and one superconducting magnet coil support structure 20 are shown, however, the disclosed system may have multiple superconducting magnets and superconducting magnet coil support structures.

The superconducting magnet coil support structure 20 is preferably a solid body and includes an exterior side 24, an exterior portion 26, and an interior side 28. The exterior side 24 is the longitudinal side farthest away from the center 30 of the scanning bore 6 that supports the superconducting magnet 14. The exterior side 24 has a plurality of shoulders 32 and a plurality of pockets 34. The plurality of shoulders 32 and the plurality of pockets 34 have dimensions corresponding to dimensions of the superconducting magnet 14. The interior portion 26 is the solid body of the superconducting magnet coil support structure 20. The interior portion 26 has a base 36. The plurality of shoulders 32 is integrally connected to the external side 38 of the base 36. The interior side 28 is preferably cylindrical shaped and is the side closest to the center 30 of the scanning bore 6.

The main magnetic field shield coil assembly 40 generates a magnetic field that opposes the field generated by the superconducting magnet coils 16. A first coil shield 42 surrounds the helium vessel 39. A second coil shield 44 surrounds the first coil shield 42. Both the first coil shield 42 and the second coil shield 44 are preferably cooled by mechanical refrigeration. The first coil shield 42 and the second coil shield 44 encases a toroidal vacuum vessel 46.

The toroidal vacuum vessel 46 includes the cylindrical member 4 that defines the scanning bore 6 and extends parallel to the longitudinal axis. On a first exterior side 50 of the cylindrical member 4, which is longitudinal side farthest away from the center 30 of the scanning bore 6, is a magnetic gradient coil assembly 52. Located on a second exterior side 54 of the magnetic gradient coil assembly 52 is a cylindrical dielectric former. A RF shield 58 is applied to the cylindrical dielectric former.

A RF transmitter 64 is connected to a sequence controller 66 and the primary RF coil (TEM 10). The RF transmitter 64 is preferably digitized. The sequence controller 66 controls a series of current pulse generators 68 via a gradient coil controller 70 that is connected to the magnetic gradient coil assembly 52. The RF transmitter 64, in conjunction with the sequence controller 66, generates pulses of radio frequency signals for exciting and manipulating magnetic resonance in selected dipoles of a portion of the subject within the scanning bore 6.

A radio frequency receiver 72 is connected with the primary RF coil 62 for demodulating magnetic resonance signals emanating from an examined portion of the subject. An image reconstruction apparatus 74 reconstructs the received magnetic resonance signals into an electronic image representation that is stored in an image memory 76. An image reconstruction device, such as a video processor 78 converts stored electronic images into an appropriate format for display on a video monitor 79.

The scanning bore 6 has a RF coil assembly 8 mounted therein. The RF coil assembly 8 includes a TEM surface resonator 10, which will be discussed regarding FIG. 2.

Figure 2:
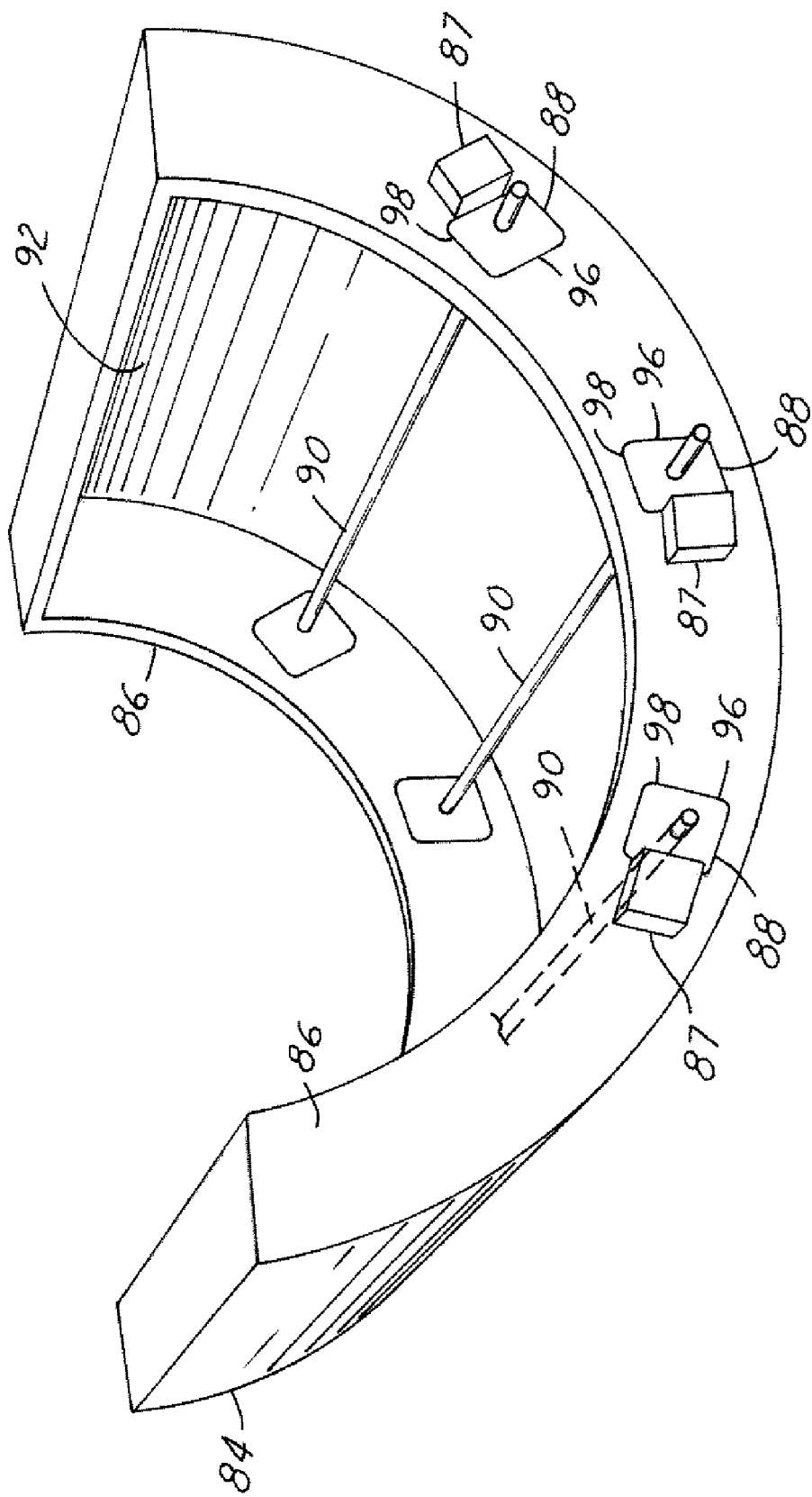
FIG. 2 is a schematic diagram of a perspective view of a TEM surface resonator in accordance with FIG. 1.

Referring to FIG. 2, the TEM surface resonator (RF coil assembly) 10 includes a cylinder 84. The cylinder 84 is capped off with a pair of annular members 86 at the front and back end of assembly 10. Each annular member 86 includes a bolt circle with a number of equally-spaced apertures 88, here illustrated as three for the present embodiment, aligned to receive the ends of three conductive rods 90 that extend between annular members 86. The TEM surface resonator 10 is illustrated as a semi-circular device, however numerous other circle dimensions, such as a three-quarter circle or a quarter circle may also be used depending on system requirements.

The cylinder 84 includes an inner tubular member 92 with an external shield 94 attached to the outer circumferential surface thereof. The inner tubular member 92 is made from insulating material, such as fiberglass or molded polyurethane, using conventional production techniques. The shield 84 is made from a thin conductive sheath of flexible circuit board material, such as RT duroid manufactured by the Rogers Corp. of Phoenix, Ariz.

The conductive layer of the shield 84 effectively establishes a ground plane for the coil assembly 10.

The annular member 86 includes a rigid circuit board material, such as an RT duroid with an insulating substrate thickness of 0.065 inches (1.651 mm) and a conductive layer on the outer side thereof. Three apertures 88 penetrate the annular member 86, equally spaced around its circumference, to support the ends of the three conductive rods 90. Circuitry sites 96 are located on an easily accessible outer surface of the annular member 86 and surround each aperture 88.

Either conventional etching techniques or other conventional circuit manufacturing techniques are used to generate the circuitry sites 96 (circuitry pads).

Lumped element circuitry is mounted to the annular member 86 and bridges each insulating gap 98. More specifically, to compensate for the inductance of each rod 90, one or more lumped element capacitors 87 are attached across each gap 98, as required for resonant operation of coil assembly 10, as is well known in the art.

Capacitors 87 may include any commercially available lumped element capacitor, though those known in the art as surface mounted or porcelain chip capacitors and commercially available from American Technical Ceramics, Inc. of Huntington Station, N.Y. are preferred. Such capacitors 87 are preferred because they have a pair of short flat plates for connection (as opposed to wire leads) minimizing device inductance, as desired. Lumped element capacitors 87 form capacitive bridges over their respective gaps 98.

The front and back annular members 86 are virtually identical, each having three apertures 88 in opposing axial alignment for receiving rods 90 there between, and three corresponding circuitry sites 96.

The conductive rods 90 are hollow tubes made from copper, though a variety of commercially available rigid conductive materials may be used. Additionally, conductive rods 90 may be solid, if desired. The ends of conductive rods 90 are soldered in place in their respective apertures 88 to make electrical contact with their respective circuitry sites 96.

For illustrative purposes, the circuit components (conductive rods 90, lumped element capacitors 87) are illustrated exposed. Typically, these are hidden from view by mechanical packaging (insulating laminae, baffles, etc.) in any final realization of the MRI system.

Figure 3:
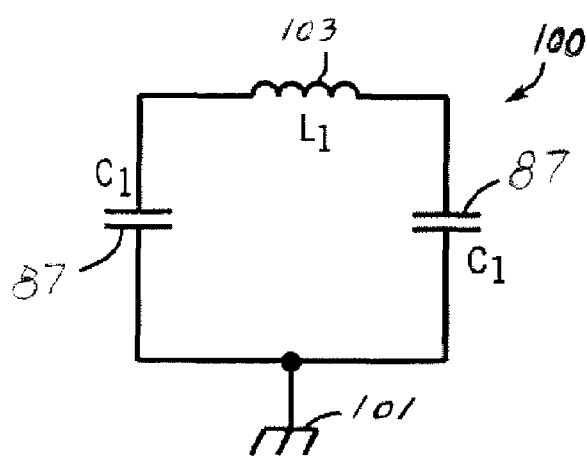
FIG. 3 is a circuit diagram of the equivalent circuit for the resonant rod terminated by two capacitors of FIG. 1.

With conductive rods 90 and lumped element capacitors 87 in place, RF coil assembly 10 provides three separate conductive segments, each including the well known low-pass pi circuit 100 represented in FIG. 3. In this FIGURE, rod inductance (L1) 103, capacitances (C1) 87, and ground 101 respectively symbolize the function of rod 90, lumped element capacitors 87, and resonator shield 84. The low-pass pi circuits 100 are conventionally tuned to substantially identical frequencies, generating an array of substantially identical coupled resonators, disposed concentrically.

Figure 4:
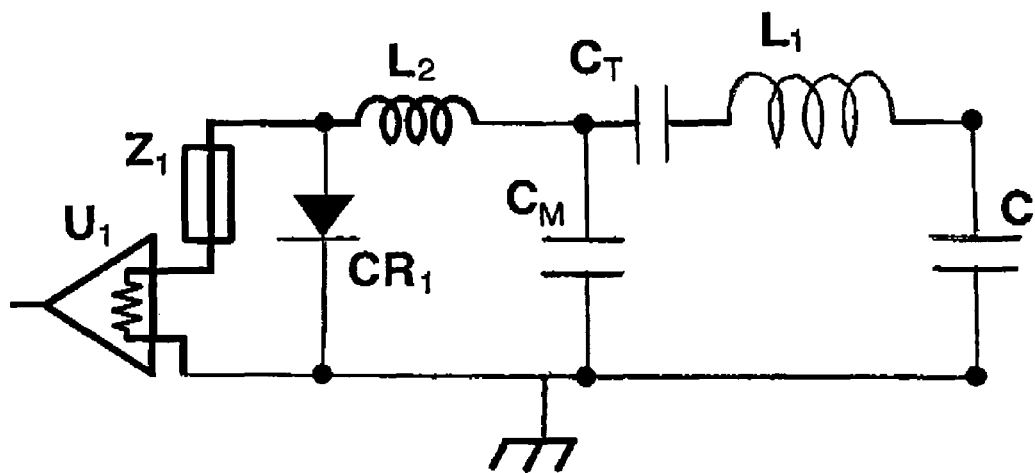
FIG. 4 is a circuit diagram of the equivalent circuit for the resonant rod, including the circuitry required for transmitter isolation as well as inter-element isolation.

Referring to FIGS. 2 and 4, the inductor L1 refers to the resonant rod 90; the capacitor C refers to an exemplar of capacitor 87, said exemplar to be taken on the side which is presented toward the viewer; the parallel combination of $C_M$ and $C_T$ refers to another exemplar of capacitor 87, attached to the selfsame exemplar of rod 90, and moreover to be taken on the side away from the viewer.

The remaining elements of FIG. 4 are presumed to be hidden from the viewer in FIG. 2, with the diode CR1 and trap inductor L2 presumed to be physically mounted on the end-ring assembly, by means of suitable circuit pads.

The series combination L1, C, CT and CM is tuned to resonate at the Larmor frequency; likewise the parallel combination L2 and CM. During transmit diode CR1 is made to conduct (by application of suitable voltage from a source not shown) thus causing resonance of the pair L2/CM. In consequence the low pass resonant pi circuit comprising L1, C, CT and CM is detuned and deactivated. A large circulating current which results is confined to the pair L2/CM, and no signal reaches the preamplifier which is thereby protected from harmful transmitter power. During reception, although the diode is switched off, the low impedance of the preamplifier is conveyed by the half wave line Z1 to the same juncture (L2 and CR1), causing effective detuning of the pi circuit as before. However, in this case, the circulating current flows in the path including the preamplifier (L2, CM, Z1, U1); arrival of said circulating current at the preamplifier causes reception of the desired signal, while the effective detuning isolates the entire resonant rod assembly from its neighbors, to at least the desired degree (−10 dB).

The present invention is a TEM surface resonator, with unconstrained element reactances. That is, several straight rods are disposed parallel to the axis of a segment of a conductive circular cylinder (an open RF shield) and connected at their ends thereto by means of conductive annular segments, which are fitted and conform to the cylindrical segment at its axial peripheries. The rods are resonated by means of fixed capacitors to form the configuration of a low pass pi circuit and are also fitted with the standard preamp decoupling circuitry used in receiver arrays, as is known in the art and detailed in FIG. 4 above. The only requirement is that inter-element cross-talk (with preamp decoupling) be at least 10 dB for nearest neighbors.

The apparatus of the present invention permits tuning the RF coil assembly to resonance with ease and efficiency. This is accomplished through lumped element, as opposed to distributed, capacitance to tune the assembly. Additionally, certain portions of the assembly permit easy access to sites for mounting the lumped element capacitors. These mounting portions are made from an insulating substrate having a conductive layer with a pattern of non-conducting gaps formed through the conductive layer.

Additionally, the present invention substantially reduces radiated loss of RF magnetic field. This is accomplished by using a shield fitting around the irradiated volume. Moreover, an end cap may be used to further limit such losses.

In operation a method for MRI scanning includes generating a parallel scan. An object is scanned from the parallel scan. The parallel scan is received in a TEM surface resonator and the image of the object is reconstructed.

The above-described steps are meant to be an illustrative example; the steps may be performed synchronously or in a different order depending upon the application.

The above-described apparatus, to one skilled in the art, is capable of being adapted for various purposes and is not limited to the following systems: MRI systems, magnetic resonance spectroscopy systems, and other applications where field instability is an issue in the design of system components. The above-described invention may also be varied without deviating from the spirit and scope of the invention as contemplated by the following claims.

What is claimed is:

1. A MRI system including a scanning unit adapted to generate a parallel scan comprising:
   a substantially cylindrical member defining a scanning bore;
   a static magnet structure comprising a superconducting magnet having a plurality of superconducting magnetic field coils adapted to generate a temporally constant magnetic field along a longitudinal axis of said scanning bore; and
   a RF coil assembly mounted in said scanning bore, said RF coil assembly comprises a TEM surface resonator array.

2. A MRI system as in claim 1 wherein said TEM surface resonator comprises a cylinder, said cylinder is capped off with a first annular member at a front and s second annular member at a back end of cylinder, said first annular member includes a first bolt circle with a first plurality of equally-spaced apertures and said second annular member includes a second bolt circle with a second plurality of equally-spaced apertures, said first plurality of apertures adapted to receive a first end of a first conductive rod, said second plurality of apertures adapted to receive a second end of said first conductive rod such that said first conductive rod extends between said first and said second annular members.

3. A MRI system as in claim 2 wherein said TEM surface resonator is substantially semi-circular.

4. A MRI system as in claim 2 wherein said cylinder includes an inner tubular member with an external shield attached to an outer circumferential surface thereof, wherein said inner tubular member comprises insulating material including fiberglass or molded polyurethane.

5. A MRI system as in claim 2 wherein said external shield comprises a thin conductive sheath of flexible circuit board material.

6. A MRI system as in claim 2 wherein said annular member comprises a rigid circuit board material.

7. A MRI system as in claim 2 wherein said first conductive rod is resonated by means of at least one fixed capacitor to form a configuration of a low pass pi circuit, said first conductive rod also fitted with a standard preamp decoupling circuitry, wherein inter-element cross-talk is at least— 10 dB for a nearest neighbor.

8. A MRI system as in claim 2 further comprising at least one lumped element capacitor adapted to compensate for an inductance of said first conductive rod.

9. A MRI system as in claim 7 wherein said at least one capacitor includes a commercially available lumped element capacitor including a surface mounted capacitor or a porcelain chip capacitor.

10. A MRI system as in claim 1 wherein said TEM surface resonator includes unconstrained element reactances.

11. A method for MRI scanning comprising:
   generating a parallel scan;
   scanning an object;
   receiving said parallel scan in a TEM surface resonator; and
   reconstructing an image of said object.

12. A method as in claim 11 further comprising demodulating magnetic resonance signals emanating from an examined portion of said object.

13. A MRI system comprising:
   a scanning unit adapted to generate a parallel scan;
   a substantially cylindrical member defining a scanning bore;
   a RF coil assembly mounted in said scanning bore, said RF coil assembly comprising a TEM surface resonator, said TEM surface resonator adapted to receive said parallel scan, said TEM surface resonator further adapted to generate an image signal; and
   an image reconstruction device adapted to receive said image signal.

14. A MRI system as in claim 13 wherein said TEM surface resonator comprises a portion of a cylinder, said cylinder is capped off with a first annular member at a front and s second annular member at a back end of cylinder, said first annular member includes a first bolt circle with a first plurality of equally-spaced apertures and said second annular member includes a second bolt circle with a second plurality of equally-spaced apertures, said first plurality of apertures adapted to receive a first end of a first conductive rod, said second plurality of apertures adapted to receive a second end of said first conductive rod such that said first conductive rod extends between said first and said second annular members.

15. A MRI system as in claim 14 wherein said cylinder includes an inner tubular member with an external shield attached to an outer circumferential surface thereof, wherein said inner tubular member comprises insulating material including fiberglass or molded polyurethane.

16. A MRI system as in claim 14 wherein said external shield comprises a thin conductive sheath of flexible circuit board material.

17. A MRI system as in claim 14 wherein said annular member comprises a rigid circuit board material.

18. A MRI system as in claim 14 wherein said first conductive rod is resonated by means of at least one fixed capacitor to form a configuration of a low pass pi circuit, said first conductive rod also fitted with a standard preamp decoupling circuitry, wherein inter-element cross-talk is at least−10 db for a nearest neighbor.

19. A MRI system as in claim 14 further comprising at least one lumped element capacitor adapted to compensate for an inductance of said first conductive rod.

* * * * *

UNITED STATES PATENT AND TRADEMARK OFFICE
CERTIFICATE OF CORRECTION

PATENT NO. : 7,015,695 B2 Page 1 of 1
DATED : March 21, 2006
INVENTOR(S) : James S. Tropp, Daniel K. Sodickson and Michael A. Ohliger It is certified that error appears in the above-identified patent and that said Letters Patent is hereby corrected as shown below:

Column 7,
Line 67, after "and" delete "s".

Signed and Sealed this

Twenty-third Day of May, 2006

JON W. DUDAS
*Director of the United States Patent and Trademark Office*